United States Patent
Todokoro et al.

(10) Patent No.: US 6,444,981 B1
(45) Date of Patent: Sep. 3, 2002

(54) SCANNING ELECTRON MICROSCOPE

(75) Inventors: Hideo Todokoro, Hinode-machi; Sho Takami, Hitachinaka; Makoto Ezumi, Mito, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/427,000

(22) Filed: Oct. 26, 1999

(30) Foreign Application Priority Data

Oct. 29, 1998 (JP) .......................................... 10-308055

(51) Int. Cl.$^7$ ................................................ H01J 37/28
(52) U.S. Cl. .................. 250/310; 250/311; 250/306
(58) Field of Search ................................ 250/306, 307, 250/310, 309, 311, 492, 397

(56) References Cited

U.S. PATENT DOCUMENTS

| | | | | |
|---|---|---|---|---|
| 5,146,090 A | * | 9/1992 | Plies ........................... | 250/310 |
| 5,389,787 A | | 2/1995 | Todokoro et al. ........... | 250/310 |
| 5,939,720 A | * | 8/1999 | Todokoro .................... | 250/310 |
| 6,084,238 A | * | 7/2000 | Todokoro et al. ........... | 250/310 |
| 6,194,729 B1 | * | 2/2001 | Weimer ....................... | 250/310 |

FOREIGN PATENT DOCUMENTS

| | | |
|---|---|---|
| JP | 6139985 A | 5/1994 |
| JP | 9171791 A | 6/1997 |

OTHER PUBLICATIONS

"Some approaches to low–voltage scanning electron microscopy" by Mullerova et al., Ultramicroscopy 41 (1992), pp. 399–409, North–Holland.

* cited by examiner

*Primary Examiner*—Jack Berman
*Assistant Examiner*—K Fernandez
(74) *Attorney, Agent, or Firm*—Kenyon & Kenyon

(57) ABSTRACT

A scanning electron microscope using the retarding method and the boosting method includes a sample holder for holding a sample on the sample holder; a shield electrode arranged between an object lens and the sample, in which an aperture for passing said primary electron beam is formed; a negative-voltage applying circuit for applying a negative voltage to the sample holder and the shield electrode; an acceleration tube located in an electron-beam passing hole in the object lens, provided to pass a primary electron beam, for further accelerating the primary electron beam; and a control electrode located between the acceleration tube and the sample, in which an aperture whose size is smaller than the aperture formed in said shield electrode is provided to pass the primary electron beam, a positive voltage in the positive direction to the negative voltage being applied to the control electrode, superimposed on the negative voltage.

18 Claims, 7 Drawing Sheets

SCANNING ELECTRON MICROSCOPE

BACKGROUND OF THE INVENTION

The present invention relates to a scanning electron microscope for obtaining a two-dimensional scanned image to representing the shape or the composition of the surface of a sample by scanning the surface of the sample with an electron beam and detecting secondary-signal electrons generated from the sample, and especially to a scanning electron microscope suitable for observing a semiconductor sample in a low acceleration region with a high-resolution.

A scanning electron microscope is an apparatus in which electrons emitted from a heating-type or field-emission-type electron source are accelerated, and formed into a thin electron beam (the primary electron beam) with an electrostatic-field or magnetic-field lens, the sample to be observed is two-dimensionally scanned with the primary electron beam, the secondary signal of secondary or reflected electrons generated from the sample irradiated with the primary electron beam is detected, and a two-dimensional scanned-image is obtained by inputting the strength of the detected secondary signal to a luminance modulation device of a Braun tube which is scanned synchronizing with the scanning of the primary electron beam.

The scanning electron microscope accelerates electrons emitted from the electron source to which negative voltage is applied, toward an anode whose voltage is the ground voltage, and scans an observed sample with the primary electron beam. Since the micro-processing has been greatly improved in the semiconductor industry, scanning electron microscopes have been widely used for examining the processing of semiconductor elements or processed semiconductor elements (for example, size measurement or electrical operations using an electron beam) in place of an optical microscope. In order to observe a sample (a wafer) made of insulating material, it is necessary to accelerate the primary electron beam with a voltage less than 1 kV, which makes it possible to examine the sample during semiconductor processing without electrifying the sample. In the above conventional scanning electron microscope (referred to as a SEM), the resolution attained under the condition of the 1 kV acceleration voltage has been 10 nm. In accordance with the development of finer processing of semiconductor elements, a scanning electron microscope whose resolution is finer than 10 nm under a low acceleration voltage has been in greater demand.

The retarding method is well known as a method of solving the above subject. In this method, the diameter of an electron beam accelerated under an acceleration voltage higher than 1 kV is decreased, and the negative voltage is applied in advance to a sample to be irradiated with the electron beam.

Accordingly, the acceleration voltage applied to the emitted primary electron beam is decreased to a required value due to the negative voltage applied to the sample just before the electron beam is injected in the sample. By using this retarding method, the aberration of an object lens can be reduced, which improves the resolution of the scanning electron microscope.

The fundamental composition of a scanning electron microscope using the retarding method is shown in FIG. 3 on page 402 in the paper "Some approaches to low-voltage scanning electron microscopy" by Müllerová et al., Ultramicroscopy 41 (1992), pp. 399–410, North-Holland.

Further, in Japanese Patent Application Laid-Open No. Hei. 9-171791, a scanning electron microscope using the retarding method is disclosed. In this scanning electron microscope, the boosting method of further accelerating the primary electron beam in an object lens is adopted in addition to the retarding method of applying a negative voltage to a sample. The boosting method also contributes to the improvement of the resolution.

Furthermore, in this SEM, an electrode arranged between a sample holder and the object lens, to which the same negative voltage as that applied to the sample holder is applied is disclosed. According to the above composition, the conductive members to which the same negative voltage is applied are arranged over and under the sample, respectively. Moreover, even if the sample is made of insulating material, it becomes possible to apply a desired amount of negative voltage (hereafter referred to as the retarding voltage) to the sample.

For example, if the sample is a silicon wafer whose top and bottom surfaces are covered with oxide film, when the negative voltage is applied to the sample holder, the value of the voltage applied to the sample is a value determined according to the ratio of the electrostatic capacitance formed between the object lens and the sample to the electrostatic capacitance formed between the sample and the sample holder, and the desired retarding voltage cannot be precisely applied.

The technique disclosed in Japanese Patent Application Laid-Open No. Hei. 9-171791 is devised to solve the above problem.

That is, even if the sample is made of insulating material, by arranging the sample in a region in which the potential is equal to the negative retarding voltage, which is formed by the two conductive members (the electrode and the sample holder), it is possible to apply any desired retarding voltage.

To attain the above object, an aperture to pass the primary electron beam is provided in the electrode (hereafter referred to as the shield electrode). The diameter of the aperture is determined as the size such that the electric field generated by the potential difference between the point irradiated with the primary electron irradiation point and elements outside the aperture (the object lens or the boosting electrode) reaches the irradiated point. This is because if the aperture is so narrow that the generated electric field does not reach the irradiated point, the secondary-signal electrons (especially secondary electrons) cannot be transmitted to the side of the detectors.

In the boosting method disclosed in Japanese Patent Application No. Hei. 9-171791, the acceleration tube to which the high positive voltage is applied is located inside the electron beam passing hole of the objective lens. In this composition, since a strong electric field is formed between the sample and the acceleration tube, if the sample is a semiconductor element, the sample may be broken or deteriorate according to the kind of material the sample is composed of.

As mentioned above, it is required that an electric field of a certain strength be generated between the sample and the elements outside the aperture of the shield electrode. On the other hand, it is also required that an excessively strong electric field should not act on the sample.

Both the above retarding method and the boosting method are used to improve the resolution. That is, both these methods- are used to set the energy (acceleration energy) of the primary electron beam at a level higher than that of the electron beam injected in the sample. For example, by accelerating the primary electron beam with 7 kV when the electron beam passes through the object lens and by setting the final acceleration voltage of the electron beam as 800 V, the resolution of 10 nm obtained at the acceleration voltage of 1 kV can be improved to the resolution of 3 nm.

As one of the means for materializing the above acceleration-voltage arrangement, the following boosting means is possible, that is, a boosting means in which an electron beam with energy of 800V is emitted, and the electron beam is accelerated with about 7 kV when the electron beam passes through an object lens by applying the positive voltage of 6.2 kV to an acceleration tube provided at an electron-beam passing aperture in the object lens. This boosting means cause a problem that since the electron beam with low acceleration voltage of 800V tends to be affected by an electric or magnetic field, the electron beam receives effects of electrification due to stains on the inside surfaces of the microscope, or the outside magnetic field, which makes it difficult to obtain the theoretical resolution. Further, a comparatively difficult design of the acceleration tube is required to stably applying the voltage of 6.2 kV to the acceleration tube without discharge from the acceleration tube.

As another one of the means for materializing the above acceleration-voltage arrangement, the following retarding means is possible, that is, a retarding means in which an electron beam with energy of 7 kV is emitted, and the final acceleration voltage of the electron beam is adjusted as 800V by applying the voltage of 6.2 kV to the sample after the electron beam has passed through the object lens. In this retarding means, although the electron beam is hardly affected by electrification of the inside surface of the microscope or the outside magnetic field because the electron beam possesses the high energy of 7 kV, it is required to apply the voltage of 7 kV and 6.2 kV to the electric gun and the sample, respectively. Applying such a high voltage to the electric gun needs a greatly careful design of the electric gun. It is generally said that the difficulty of a design of the electrical gun is proportional to the applied voltage. This can be also said for applying the retarding voltage of 6.2 kV to the sample.

SUMMARY OF THE INVENTION

The present invention has been devised to address the above contradictions, and is aimed at providing a scanning electron microscope using the retarding and boosting methods, which is capable of generating an electric field sufficient and necessary to transmit the secondary-signal electrons to detectors without applying an unnecessarily strong electric field to a sample.

To attain the above object, the present invention provides a scanning electron microscope with high resolution realized by using both the retarding method and the boosting method and combining a control electrode provided between an acceleration tube and a sample while well balancing the retarding, boosting, control electrode voltage values from economic and technical standpoints. For example, the electron-gun voltage is set to about 2 kV, and the voltage of about 5 kV is applied to the acceleration tube. It is not technically difficult to apply the voltage of 5 kV to the electron gun, although the structure of the electron gun is complicated, and the electron gun includes a complicated electrical circuit. Moreover, it is comparatively easy to compose the acceleration tube possessing a withstand voltage of 5 kV. Naturally, it is also possible to set the voltage of the electron gun to 3 kV and to apply the voltage of 4 kV to the acceleration tube. One of main features is to provide a scanning electron microscope composed so that the voltage distribution among the electron gun, the acceleration tube, and the sample can be optimally set from the technical and economic standpoints. The composition of each scanning electron microscope according to the present invention are described below.

That is, the present invention provides a scanning electron microscope including an electron source, an object lens for converging a primary electron beam emitted from the electron source, and at least one detector for detecting electrons generated from a sample irradiated with the primary electron beam converged by the object lens, the scanning electron microscope comprising:

a sample holder for holding the sample on the sample holder;

a shield electrode arranged between the object lens and the sample, in which an aperture for passing the primary electron beam is formed;

negative voltage applying means for applying a negative voltage to the sample holder and the shield electrode;

an acceleration tube located in an electron-beam passing hole in the object lens, provided to pass the primary electron beam, for further accelerating the primary electron beam; and a control electrode arranged between the acceleration tube and the sample, in which an aperture whose size is smaller than the aperture formed in the shield electrode is provided to pass the primary electron beam, a positive voltage in the positive direction to the negative voltage being applied to the control electrode, superimposed on the negative voltage.

Furthermore, in the above scanning electron microscope, a value of voltage applied to the electron gun is in a range of about 2 kV to 5 kV, a positive voltage less than 7 kV is applied to the acceleration tube, and an acceleration voltage applied to the primary electron beam injected in the sample is adjusted by changing the negative voltage applied to the sample holder and the shield electrode.

According to the above composition, the control electrode can reduce the strong electric field generated between the acceleration tube and the sample, and since the voltage obtained by superimposing a definite amount of positive voltage to the negative voltage applied to the sample is applied to the sample, it is possible to transmit the secondary-signal electrons generated at the point of the sample, irradiated with the primary electron beams above the aperture of the control electrode.

DETAILED DESCRIPTION OF THE EMBODIMENTS

Hereafter, details of the embodiments will be explained with reference to the drawings. Further, to assist in understanding the concept of the present invention, the scanning electron microscope of the present invention in which a control electrode is used will be explained in comparison with a conventional scanning electron microscope without a control electrode.

Figure 1:
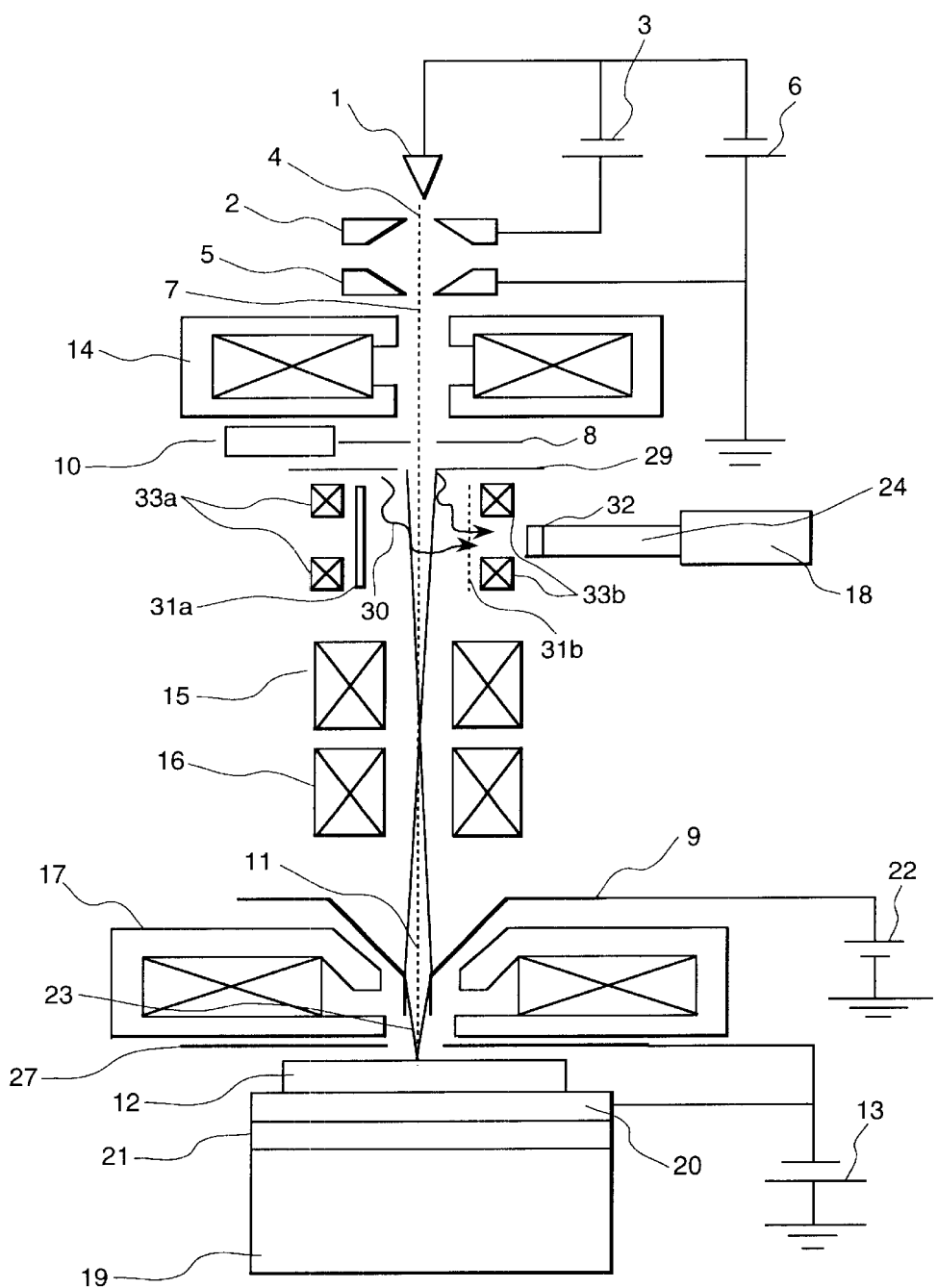
FIG. 1 is a vertical view showing the composition of a scanning electron microscope in which the primary electron beam is accelerated with low voltage.

FIG. 1 shows the composition of a conventional scanning electron microscope without a control electrode. When the electron-leading voltage 3 is applied between the fielde-mission cathode 1 and the electron-leading electrode 2, the emitted electrons 4 are emitted. The emitted electrons 4 are further accelerated (sometimes decelerated) between the electron-leading electrode 2 and the anode 5 with the ground voltage. The acceleration voltage of the electron beam (the primary electron beam 7) is equal to the electron-gun voltage 6.

The primary electron beam 7 accelerated by the anode 5 is converged by a condenser lens 14, and is further deflected for scanning motion by the upper and lower scanning deflectors 15 and 16. Changes in the deflection strength of the scanning deflectors 15 and 16 are adjusted so that the sample 12 is two-dimensionally scanned with the primary electron beam 7, and the fulcrum of the scanning is the center of the object lens 17.

The deflected primary electron beam 7 is further accelerated according to the quantity of voltage applied to the acceleration tube 9 by a boosting-voltage source 22 using the acceleration tube 9 provided in the passage through the objected lens 17. The diameter of the primary electron beam 7 is reduced to a small one and focused on the sample by the object lens 17. The primary electron beam 7 which has passed through the object lens 7 is decelerated by the deceleration electric field generated between the object lens 17 and the sample 12 by the negative voltage applied to the sample 12 from the retarding-voltage source 13, and the beam 7 reaches the sample 12.

According to the above composition, when the primary electron beam 7 passes through the object lens 17, the acceleration voltage of the beam 7 is (the electron-gun acceleration voltage+the voltage applied to the boosting tube 9 from the boosting-voltage source 22), and is higher than the acceleration voltage (the electron-gun acceleration voltage—the voltage applied to the shield electrode 27 from the retarding-voltage source 13) applied to the beam 7 when the beam 7 is injected in the sample 12. Accordingly, a thinner(higher resolution) electron beam can be obtained in comparison with that obtained when the primary electron beam 7 is accelerated by the voltage (the electron-gun acceleration voltage—the voltage applied to the shield electrode 27 from the retarding-voltage source 13) when the beam is injected in the sample 12. Thus, the chromatic aberration can be reduced.

In a typical example, the voltage applied to the primary electron beam by the electron-gun acceleration voltage source 6, the voltage applied by the boosting-voltage source 22, and the voltage applied by the retarding-voltage source 13 are 2 kV, 7 kV, and 1 kV, respectively.

In this example, the primary electron beam 7 with the energy of 9 kV passes through the object lens 17, and the acceleration voltage of the beam 7 injected in the sample 12 is 1 kV. The resolution in this example is improved to about 3 nm, which is one third of the resolution 10 nm obtained the beam 7 is accelerated with 1 kV.

When the sample 12 is irradiated with the primary electron beam 7, secondary-signal electrons 23 are generated. The secondary-signal electrons 23 are composed of secondary electrons and reflected electrons. The electric field generated between the object lens 17 and the sample 12, and the electric field generated between the sample 12 and the acceleration tube 9 act on the secondary-signal electrons 23 as the acceleration electric field. Therefore, the secondary-signal electrons 23 are sucked into the passage through the object lens 17, and rise while receiving the lens-action of the object lens 17.

The secondary-signal electrons 23 which have passed through the object lens 17 further pass through the scanning deflectors 15 and 16, and collide with a reflection plate 29. This reflection plate 29 is made of conductive material, and possesses an aperture for passing the primary electron beam 7 at its center. Film of material that can efficiently generate secondary electrons, for example, gold, is deposited on the surface of the reflection plate 29, with which the secondary-signal electrons 23 collide. The secondary-signal electrons 23 (secondary electrons and reflected electrons) proceed on almost the same trajectory, and collide with the reflection plate 29.

The secondary and reflected electrons which have collided with the reflection plate 29 generate secondary electrons 30 at the reflection plate 29. The secondary electrons generated at the reflection plate 29 are deflected by the electric field generated between the electrostatic-deflection electrode 31a to which the negative grounding voltage is applied and the electrostatic-deflection electrode 31b, to which the positive grounding voltage is applied. The electrostatic-deflection electrode 31b is a mesh-type electrode such that the deflected secondary electrons 30 can pass through the electrode 31b. Numerals 33a and 33b indicate magnetic deflection coils generating a magnetic field perpendicular to the electric field generated by the electrostatic-deflection electrodes 31a and 31b, in order to compensate for the deflection of the primary electron beam 7 due to the electrostatic electric field.

The secondary electrons 30 which have passed through the mesh-type electrostatic-deflection electrode 31b are sucked into a scintillator 32 to which the high voltage of 10 kV is applied. Further, the secondary electrons 30 collide with the scintillator in the scintillator 32, and emit light. This light is transmitted to a photomultiplier 18 by a light tube 24. Furthermore, the multiplied light is converted to an electrical signal, and is amplified. The brightness modulation in a Braun tube is performed with this output amplified signal.

A diaphragm 8 is provided to adjust the aperture angle of the primary electron beam 7, and the axis alignment for the diaphragm 8 is carried out by an adjustable finger-screw 10. Numeral 19 indicates an X-Y movement mechanism for moving the sample 12 in the X and Y directions. A sample holder 20 is placed on the X-Y movement mechanism via an insulating plate 21, and the retarding voltage is applied to the sample holder 20 from the retarding-voltage source 13. The sample 12, such as a semiconductor wafer, is mounted on the sample holder 20. Accordingly, the retarding voltage is also applied to the sample 12 mounted on the sample holder 20 from the retarding-voltage source 13.

A shield electrode 27 is located so as to cover the sample 12. This shield electrode 27 is provided so that even if the sample is made of insulation material, the required retarding voltage can be applied to the sample 12 from the retarding-voltage source 13. A typical example of a sample made of insulation material is a semiconductor sample such as a silicon wafer, whose top and back faces are covered with oxide film.

In the event that the shield electrode 27 is not provided, even if the sample 12 made of insulation material is mounted on the sample holder 20, and the retarding voltage is applied to the sample 12 from the retarding-voltage source 13, the value of the voltage applied to the sample 12 is a value determined according to the ratio of the electrostatic capacitance formed between the object lens 17 and the sample 12 to the electrostatic capacitance formed between the sample 12 and the sample holder 20, and the required retarding voltage cannot be precisely applied to the sample 12 from the retarding-voltage source 13.

The shield electrode 27 is provided to prevent the above problem. Thus, this electrode 27 covers the whole of the sample 12, and a voltage equal to that of the sample holder 20 is applied to this electrode 27. Further, an aperture for passing the electron beam 11 is formed in this electrode 27. A typical diameter of the aperture is 20 mm, and the distance between the sample 12 and the bottom face of the object lens 17 is 3 mm. Since the diameter of a sample such as a semiconductor wafer is larger than 100 mm, 20 mm size does not diminish the effectiveness of the shield electrode 27. Further, since the distance between the sample 12 and the bottom face of the object lens 17 is 3 mm, the influence of this size of an aperture on the electric field on the surface of the irradiated sample 12 is very small.

A typical example of a scanning electron microscope with the above shield electrode 27 is explained below, in which the voltage applied by the electron-gun acceleration voltage source 6, the voltage applied by the boosting-voltage source 22, and the voltage applied by the retarding-voltage source 13 are 2 kV, 7 kV, and 1 kV, respectively. In this example, the strength of the electric field generated between the object lens 17 and the sample 12 is 3 kV/cm. Moreover, if an attempt is made to obtain a higher resolution, the higher voltage applied by the electron-gun acceleration voltage source 6 and the boosting-voltage source 22 are required. Thus, the stronger electric field is applied to the surface of the sample 12. The semiconductor sample may be broken or deteriorated according to the kind of material the sample is made of.

The above deceleration electric field is necessary to transmit the secondary-signal electrons above the object lens 17, and an electric field of a certain strength is necessary. That is, the shield electrode 27 is required to hold the voltage of the sample 12 made of insulation material at the retarding voltage applied by the retarding-voltage source 13, and is also necessary to raise the secondary-signal electrons above the object lens 17. However, the scanning electron microscope shown in FIG. 1 cannot satisfy the above requirement.

Figure 2:
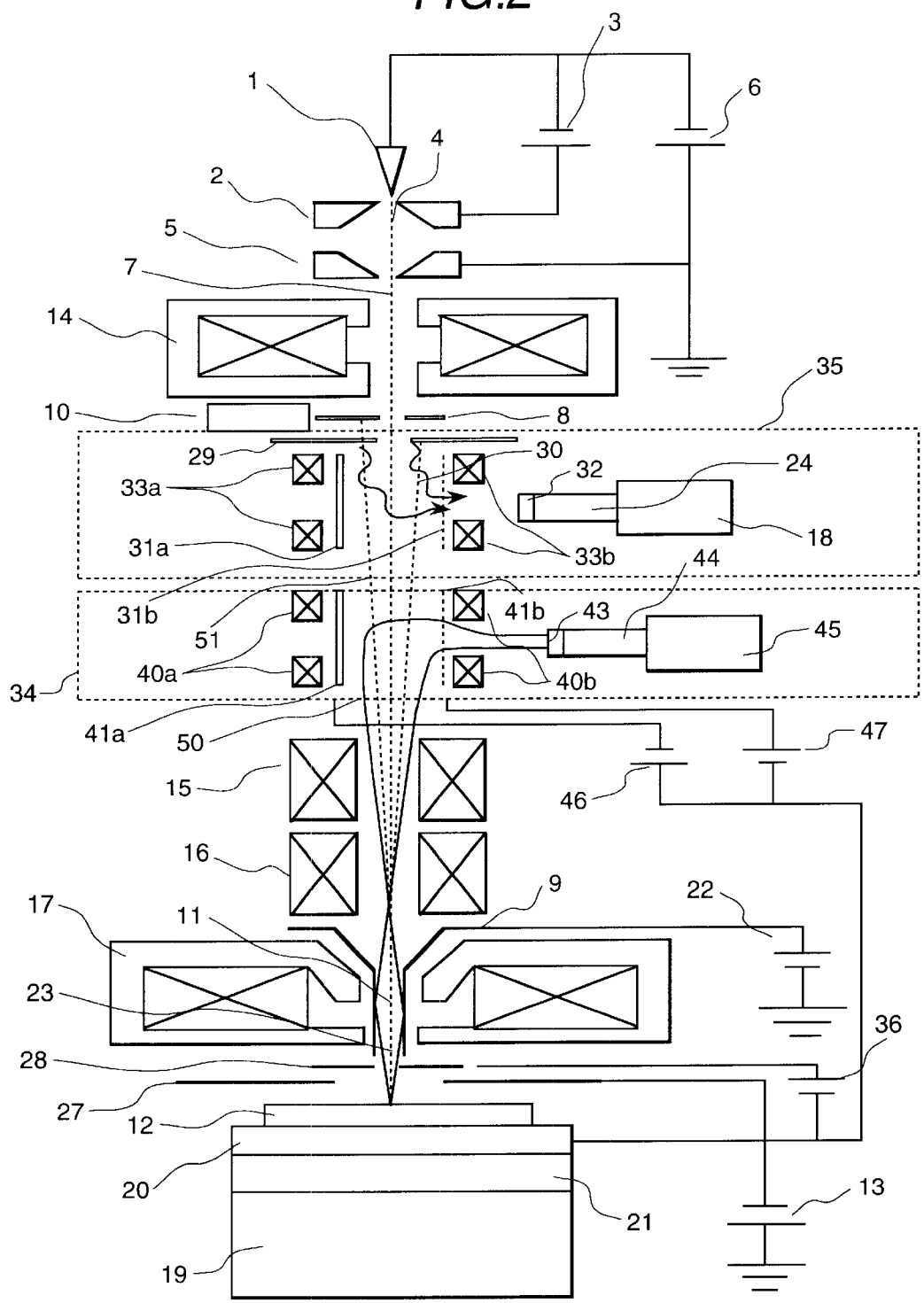
FIG. 2 is a vertical view showing the composition of a scanning electron microscope of an embodiment according to the present invention.

FIG. 2 shows the composition of a scanning electron microscope of an embodiment according to the present invention. In this embodiment, a control electrode 28 is provided between the shield electrode 27 and the object lens 17, and the control voltage is applied to the control electrode 28 from the control-voltage source 36. In the scanning electron microscope of this embodiment, it is possible to conveniently control the electric field on the surface of the sample 12 by adjusting the control voltage with the control-voltage source 36. In this embodiment, the control voltage applied by the control-voltage source 36 is several hundreds of V. Also, as one of the optimal voltage distributions determined from economic and technical standpoints, the voltage to accelerate primary electrons emitted from the electron source is in the range of about 2 kV to 5 kV, and the positive voltage applied to the acceleration tube 9 located in the aperture of the object lens 17, for passing the primary electron beam 7, is less than 7 kV.

If the voltage applied to the control electrode from the control-voltage source 36 is held constant, a constant electric field can be applied to the surface of the sample 12, independent of the voltage applied by the retarding-voltage source 13. The diameter of the aperture in the shield electrode 27 is 20 mm, such that the electric field created by the control electrode 28 can reach the surface of the sample 12.

However, it is desirable to compose the control-voltage source 36 so that the control voltage is changeable, and so that an operator can adjust the control voltage to a desired value. This is because the tolerance of the sample 12 against the electric field applied to the surface of the sample 12 depends on the kind of material composing the sample 12. On the other hand, if the breakdown of the sample 12 can be disregarded, the larger potential difference between the sample 12 and the outside element (the control electrode 28 in the scanning electron microscope of this embodiment) can more efficiently transmit the secondary-signal electrons above the control electrode 28. The voltage applied to the control electrode 28 should be determined by considering a balance between the breakdown risk of the sample 12 and the efficiency in the upward transmission of the secondary-signal electrons.

Moreover, the voltage applied to the control electrode 28 can be set automatically by inputting either the type (material composition) of the sample 12, or the magnifying power to an input unit connected to a control unit (these units are not shown in FIG. 2). In this example, the relationship between the type of the sample 12 or the magnifying power and the value of the control voltage applied to the control electrode 28 is stored in the memory of the control unit, and the control voltage is automatically selected and applied to the control electrode 28 from the control-voltage source 36 based on the information input from the input unit.

Furthermore, in this embodiment, detectors 34 and 35 are provided in two stages (the first and second stages) between the condenser lens 14 and the upper scanning deflector 15. The composition of the first detector 35 is the same as that of the detector shown in FIG. 1. Although the composition of the second detector 34 is almost the same as that of the detector 35, the retarding voltage applied to the sample 12 is also applied to the middle point between the respective deflection voltage (the negative deflection voltage 46 and the positive deflection voltage 47) applied to the electrostatic-deflection electrodes 41a and 42b by the retarding-voltage source 13.

In this embodiment, the reflection plate is not provided. The method of detecting the secondary-signal electrons 23 is explained below. The voltage values of the electron-gun acceleration voltage source 6, the boosting-voltage source 22, and the retarding-voltage source 13 are 2 kV, 7 kV, and 1 kV, respectively. The secondary-signal electrons 23 including the secondary electrons with a peak density at about 2V, whose energy distributes in the range of 0 to 10V, and the reflected electrons with energy of 1 kV, are accelerated by the retarding voltage applied to the sample 12 from the retarding-voltage source 13 and the boosting-voltage source 22. Accordingly, the secondary electrons with energy of 8 kV and the reflected electrons with energy of 9 kV pass through the object lens 17. After the 4 secondary-signal electrons 23 have passed through the acceleration tube 9, the secondary-signal electrons 23 are decelerated by the voltage of the boosting-voltage source 22, and the energy values of the secondary electrons and the reflected electrons become 1 kV and 2 kV, respectively.

Since the voltage of the retarding-voltage source 13 is applied to the middle point of the electrostatic-deflection electrodes 41a and 41b in the lower detector (the second detector 34), when the secondary-signal electrons 23 enter the cylindrical deceleration region formed by the electrostatic-deflection electrodes 41a and 41b, the secondary-signal electrons 23 are further decelerated, and the energy values of both the secondary and reflected electrons return to their original emission energy values; that is: 0–10V for the secondary electrons, and about 1 kV for the reflected electrons.

Only the secondary electrons 50 with low energy are deflected by the electric field generated by the electrostatic-deflection electrodes 41a and 41b, and pass through the mesh-type electrostatic-deflection electrode 41b. Further, the secondary electrons which have passed through the electrode 41b enter the scintillator 43 and generate emissions of light. Furthermore, the emitted light is transmitted to the light guide 44 and the photomultiplier 45, and is converted to an electrical signal. Moreover, the electrical signal is amplified. Thus, only the secondary electrons 50 are detected by the lower detector 34.

The magnetic field generated by the magnetic deflection coils 40a and 40b compensates for the deflection of the primary electron beam 7 due to the electrostatic-deflection electrodes 41a and 41b.

On the other hand, the reflected electrons 51 possess the high energy of about 1 kV. Therefore, the reflected electrons 51 pass through the first-stage region of the lower detector 34 while scarcely receiving the deflection, due to the electric field generated by the electrostatic-deflection electrodes 41a and 41b. After the reflected electrons 51 have passed through the first stage region of the lower detector 34, they are accelerated by the voltage of the retarding-voltage source 13, and enter the second-stage region of the upper detector 35 with energy of about 2 kV. Further, the reflected electrons 51 collide with the reflection plate 29.

The secondary electrons 30 generated at the reflection plate 29 are deflected by the electrostatic-deflection electrodes 31a and 31b. Further, the deflected electrons 30 pass through the mesh-type electrostatic electrode 31b, and are detected. The detected signal of the secondary electrons 30 reflect the strength of the reflected electrons 51. Thus, according to this embodiment, it is possible to completely separate and detect the secondary electrons and the reflected electrons.

Figure 3:
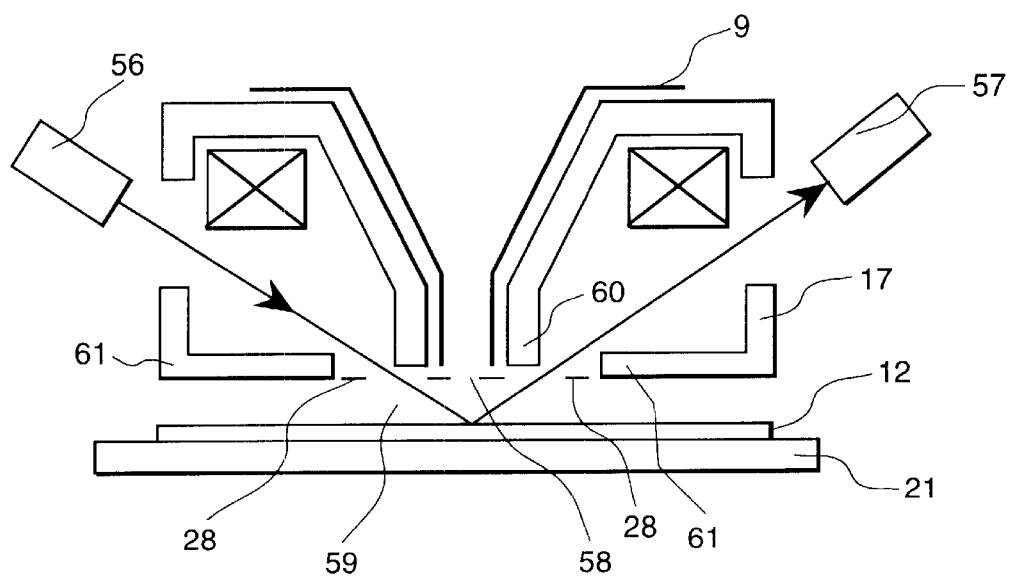
FIG. 3 is a diagram showing the composition of a scanning electron microscope of another embodiment in which a Z-sensor is added, according to the present invention.
Figure 4:
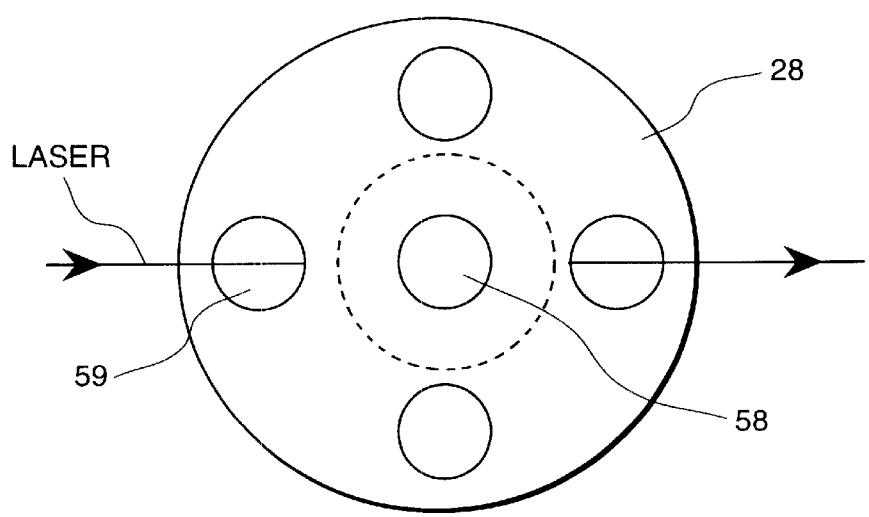
FIG. 4 is a diagram showing the composition of a control electrode in the scanning electron microscope shown in FIG. 3.

FIG. 3 shows a vertical view of the composition of the control electrode 28 using a laser Z-sensor for detecting the height of the sample 12. In FIG. 3, only the compositions of the object lens 17, the sample 12, and their neighbor region are shown. The control electrode 28 is located at the lower magnetic-pole part 61 of the object lens 17. In the control electrode 28, an electron-beam aperture 58 for passing the electron beam, and laser apertures 59 for passing a laser beam used in the Z-sensor are provided. FIG. 4 shows a plan view of the control electrode 28. The electron-beam aperture 58 is positioned at the center of the control electrode 28, and the four laser apertures 59 are arranged around the electron-beam aperture 58. The laser is injected through one of a pair of laser apertures 59 symmetrically arranged with respect to the electron-beam aperture 58, and is ejected through the other one of the pair. The reason why the four laser apertures 59 are provided is that the four laser apertures symmetrically arranged with respect to the center of the control electrode 28 are necessary to maintain the symmetrical distribution of the electrical field in the neighbor region of the electron-beam aperture 58.

Although the control electrode 28 is located at the lower magnetic-pole part 61, it is possible to locate the control electrode 28 at the upper magnetic-pole part 60. In this case, the shape of the control electrode 28 is such as that shown by a dotted-line circle in FIG. 4, and the laser apertures 59 are not necessary.

Figure 5:
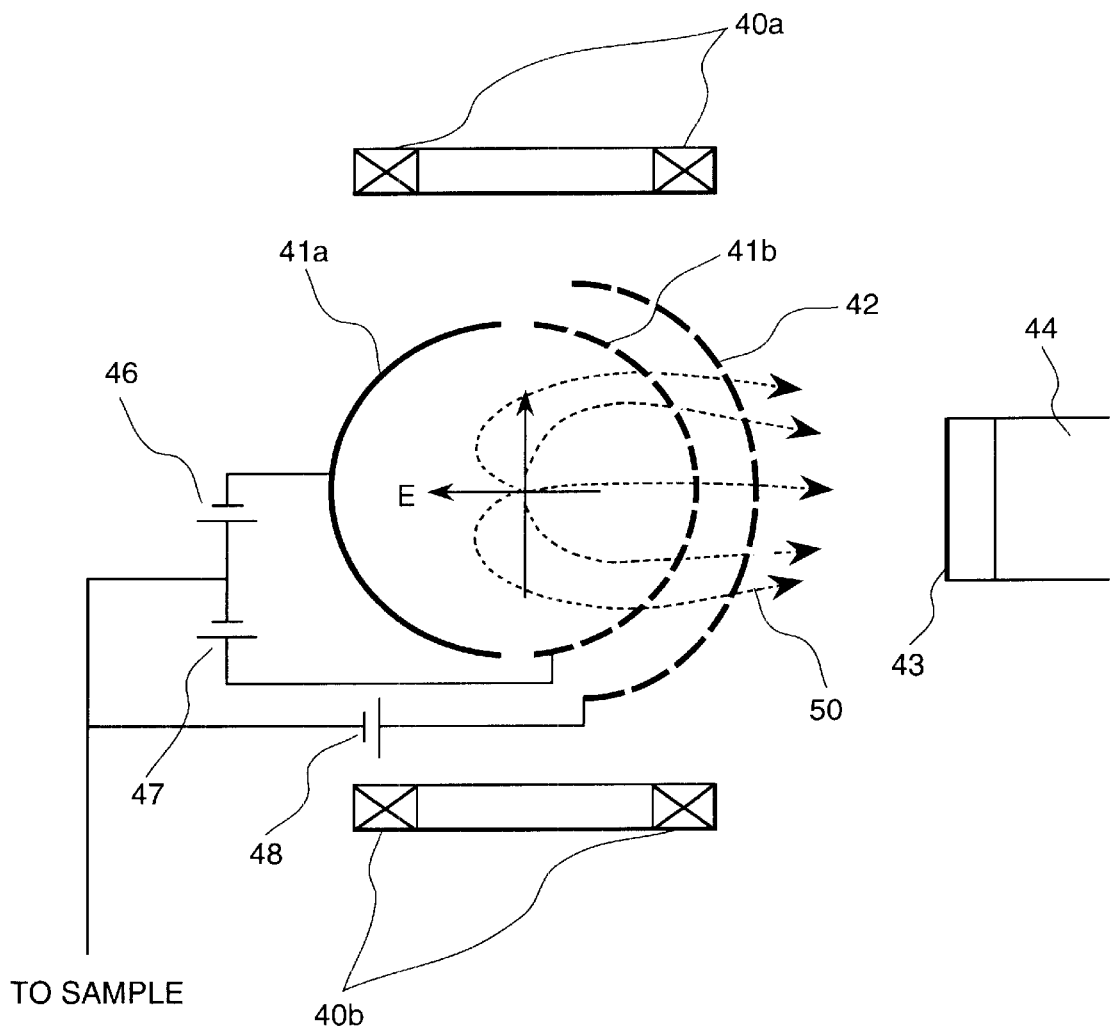
FIG. 5 is a diagram showing an example of a secondary-signal-electron detecting method.

FIG. 5 shows an example of a secondary-signal-electron detecting method using the lower detector 34. Also, this figure shows a horizontal sectional view of the lower detector 34. The shape of each of the electrostatic-deflection electrodes 41a and 41b is a half cylinder. The electrostatic-deflection electrode 41b is a mesh-type electrode such that the deflected secondary electrons 50 can pass through the electrode 41b. The electric field E for deflecting the secondary electrons 50 is generated by the negative deflection voltage 46 and the positive deflection voltage 47. Usually, the absolute value of the negative deflection voltage 46 is equal to that of the positive deflection voltage 47.

The retarding voltage is also applied to the middle point between the negative deflection voltage 46 and the positive deflection voltage 47. The deflection coils 40a and 40b generate the deflection magnetic field B perpendicular to the electric field E. The strength and direction of the magnetic field B are adjusted so that this magnetic field B compensates for the deflection of the primary electron beam 7 due to the electric deflection field E. This magnetic deflection field B acts on the secondary electrons 50 in the direction to strengthen the deflection of the secondary electrons 50. A mesh-type filter 42 is located outside the electrostatic-deflection electrode 41b. This filter 42 is provided to fractionate the secondary electrons 50 with respect to the emission energy of the secondary electrons 50, and this fractionation is adjusted by changing the voltage applied to this filter 42 by the filter voltage source 48 provided between the filter 42 and the middle point between the negative deflection voltage 46 and the positive deflection voltage 47.

If positive voltage is applied to the filter 42, secondary electrons in all energy range are passed through the filter 42. On the other hand, if negative voltage is applied to the filter 42, secondary electrons with energy less than a value corresponding to the negative voltage are turned away. Accordingly, only secondary electrons with higher energy can pass through the filter 42. The secondary electrons which have passed through the filter 42 are sucked in and accelerated by the scintillator 43, and these electrons cause light emissions. The emitted light is transmitted to the light guide 44.

It is also possible to transmit secondary electrons also by turning off the retarding-voltage source 13 for applying the retarding voltage to the middle point between the electrostatic-deflection electrodes 41a and 41b and to detect the secondary electrons with the upper stage detector 35.

Although the retarding voltage is applied to the middle point between the electrostatic electrodes 41a and 41b of the lower detector 34, secondary electrons with specified energy can be selectively detected by further applying voltage between the electrostatic-deflection electrodes 41a and 41b.

Figure 6:
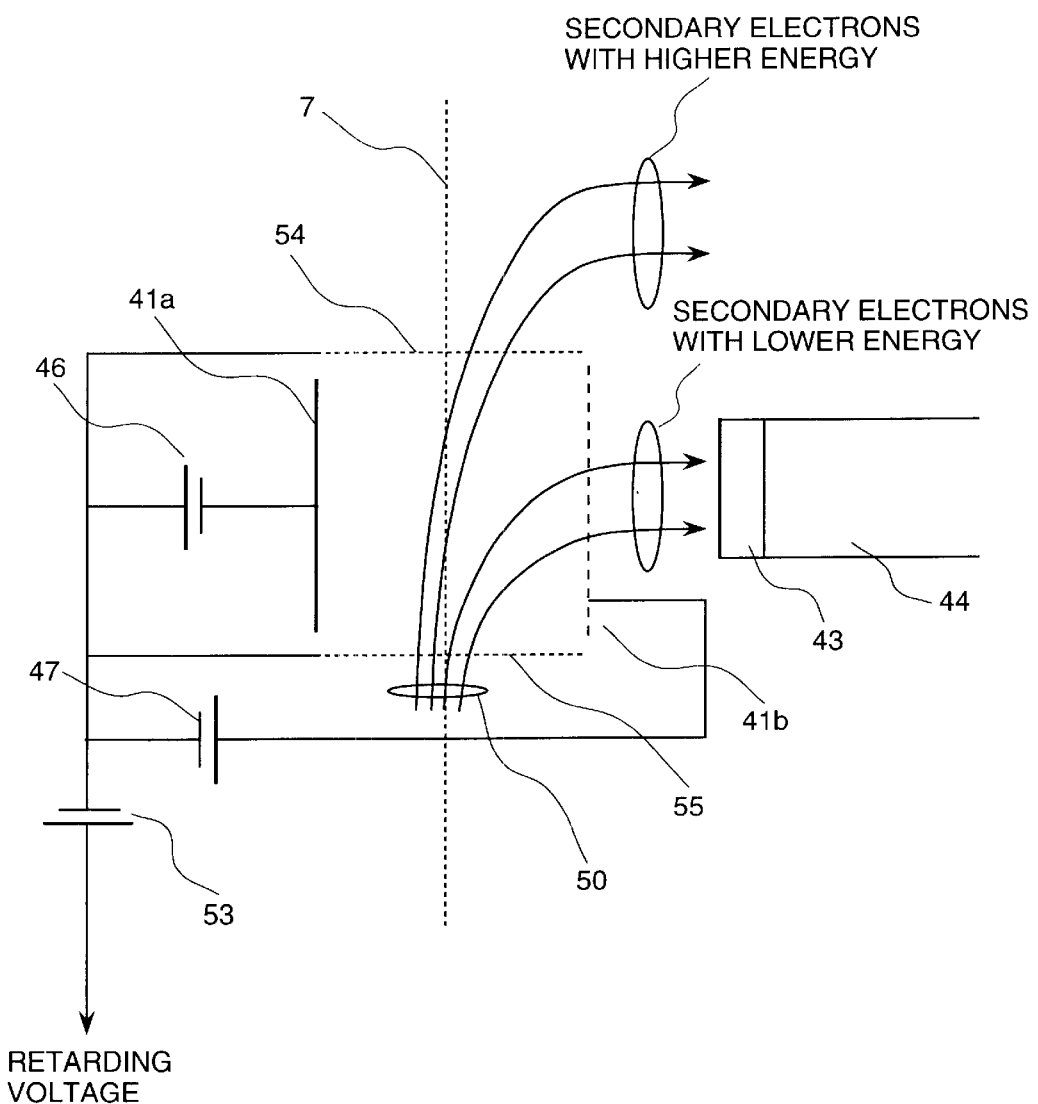
FIG. 6 is a diagram showing an example of a detection method which selectively detects the secondary electrons with a lower energy level.

FIG. 6 shows an example of a detection method which selectively detects the secondary electrons with lower energy. In this example, meshes 54 and 55 are provided at the top and bottom region of the electrostatic electrodes 41a and 41b, and are connected to the middle point between the negative deflection voltage 46 applied to the electrostatic electrode 41a and the positive deflection voltage 47 applied to the electrostatic-deflection electrode 41b.

In this example, the imposed voltage 53 is positive. For example, the imposed voltage 53 is 5V. By the above voltage application, the secondary electrons in the region surrounded by the meshes 54 and 55, and the electrostatic-deflection electrodes 41a and 41b possess a potential higher than that of electrons outside this region. The energy of the secondary electrons with higher energy is further increased. Accordingly, the amount of deflection of the secondary electrons is decreased, and the secondary electrons pass through the region while these electrons are not detected. Thus, by applying a positive voltage to the region, it is possible to selectively detect the secondary electrons with lower emission energy.

In this example, the top and bottom meshes 54 and 55 are provided in this deceleration cylinder region. However, if the deceleration cylinder region is long, the same effect is obtained. Here, an aperture for passing the primary electron beam is formed at the center of each of the top and bottom meshes 54 and 55.

Figure 7:
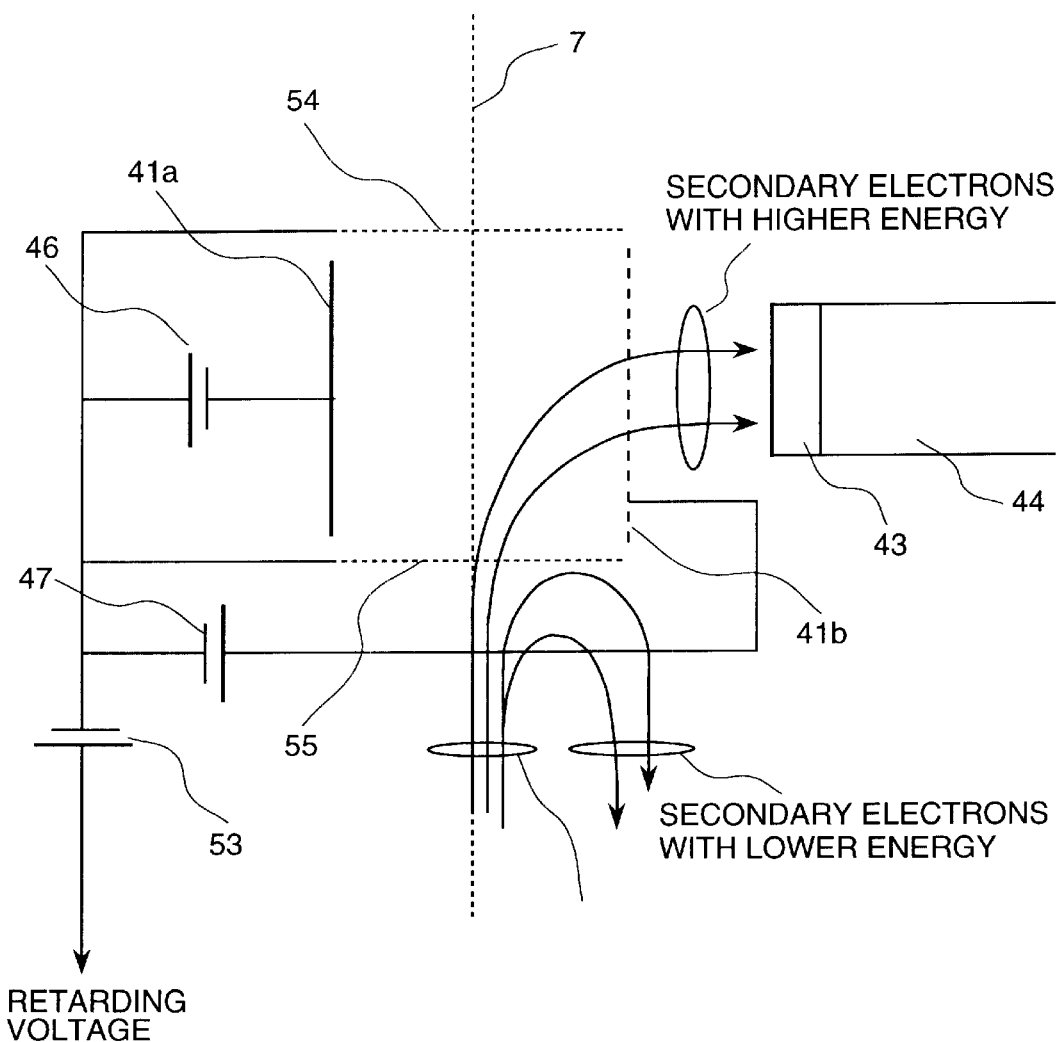
FIG. 7 is a diagram showing an example of a detection method which selectively detects the secondary electrons with a higher energy level.

FIG. 7 shows a typical example of a detection method which selectively detects the secondary electrons with higher energy. In this example, the superimposed voltage 53 is negative. Accordingly, the secondary electrons with lower emission energy are turned away, and only electrons with higher emission energy, which can pass through the mesh 55, can be detected.

Figure 8:
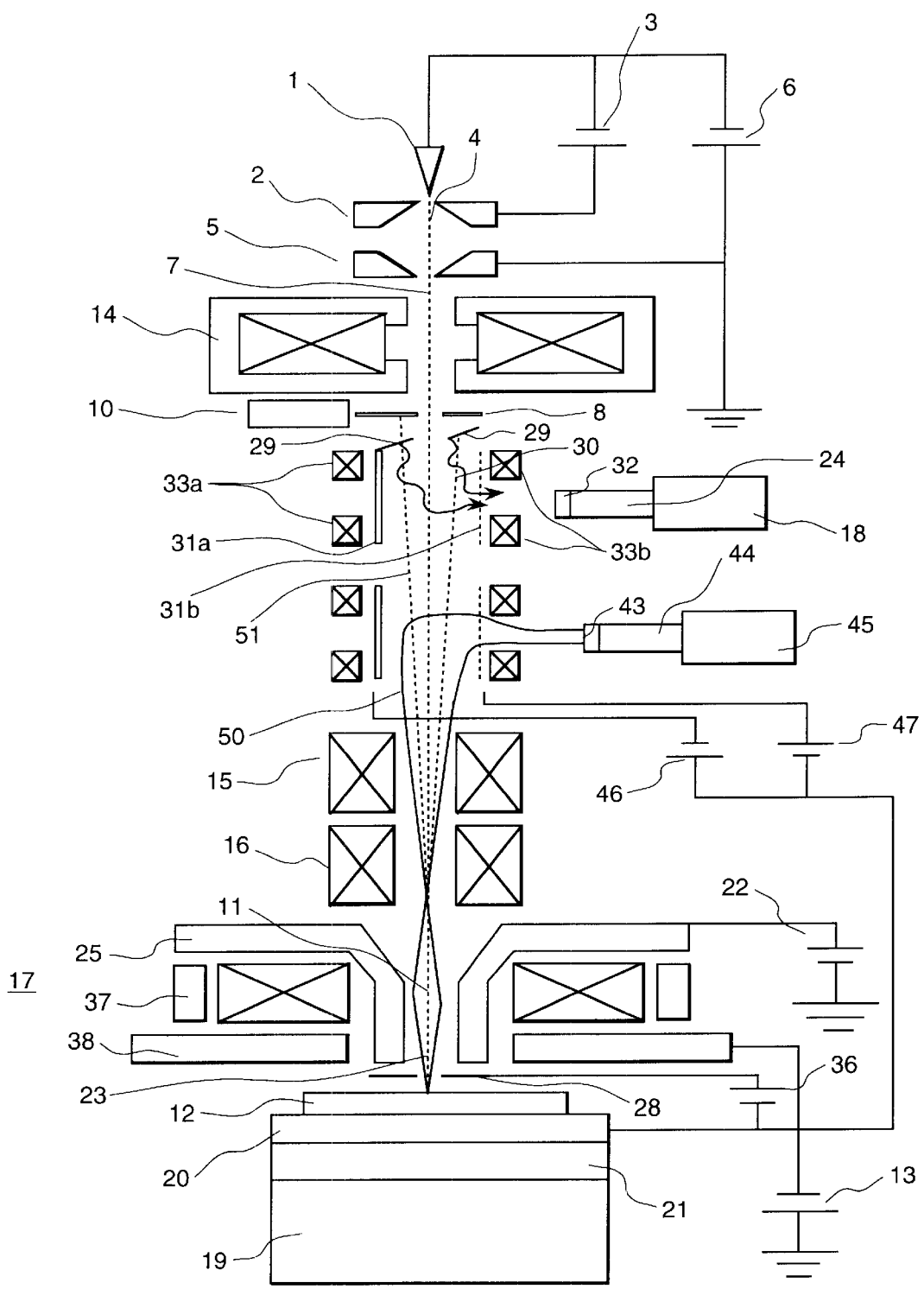
FIG. 8 is a vertical view showing the composition of a scanning electron microscope of another embodiment according to the present invention.

FIG. 8 shows a vertical view of the composition of a scanning electron microscope of another embodiment according to the present invention. In this embodiment, the magnetic circuit of the object lens 17 is divided into three magnetic circuits, that is, the upper, middle, and lower magnetic circuits 25, 37, and 38. The lower magnetic circuit 38 doubles the part of the shield electrode 27, and the retarding voltage is applied to this lower magnetic circuit 38 by the retarding-voltage source 13.

Further, the upper magnetic circuit 25 doubles the part of the boosting electrode, and the boosting voltage is applied to the upper magnetic circuit 25 by the boosting-voltage source 22. The first feature of the above-described composition is that the space into which the shield electrode 27 is inserted becomes unnecessary, which makes the focal length of the object lens 17 short, that is, makes it possible to obtain a higher resolution.

The second feature of the above-described composition is that the disagreement between the axis of the object lens 17 and the axis of the boosting electrode, which may occur in the composition shown in FIG. 2, is impossible. Further, the control electrode 28 is located at the region at the end of the upper magnet circuit 25, and the control voltage is applied to this control electrode 28 from the control-voltage source 36.

In this embodiment, the reflection plate 29 is declined toward the scintillator 32 so that the secondary electrons due to the collisions of the reflected electrons with the reflection plate 29 can be efficiently sucked into the scintillator 32.

Although the retarding voltage is applied to the shield electrode 27 from the retarding-voltage source 13, even if this retarding voltage is not used, the effect similar to that of the present invention can be obtained.

In accordance with the scanning electron microscope of the present invention, the desired retarding voltage can be precisely applied to an insulated sample which is not electrically conductive to a sample holder. Further, since the electric field necessary and sufficient to transmit the secondary-signal electrons to a detector can be generated on a sample without applying an excessively strong electric field to the sample, it has become possible to prevent a breakdown or a degradation of the sample without lowering the detection efficiency of the detector.

What is claimed is:

1. A scanning electron microscope including an electron source, an object lens for converging a primary electron beam emitted from the electron source, and at least one detector for detecting electrons generated from a sample irradiated with said primary electron beam converged by said object lens, said scanning electron microscope comprising:

a sample holder for holding said sample on said sample holder;

a shield electrode located between said object lens and said sample, in which an aperture for passing said primary electron beam is formed;

negative-voltage applying means for substantially applying the same negative voltage to said sample holder and said shield electrode;

an acceleration tube located in an electron-beam passing hole in said object lens, provided to pass said primary electron beam, for further accelerating said primary electron beam; and a control electrode located between said acceleration tube and said sample, in which an aperture whose size is smaller than said aperture formed in said shield electrode is provided to pass said primary electron beam, a positive voltage in the positive direction to said negative voltage being applied to said control electrode, superimposed on said negative voltage.

2. A scanning electron microscope according to claim 1, wherein said control electrode is connected to positive-voltage applying means for applying said positive voltage to said control electrode in addition to said negative voltage applied by said negative-voltage applying means.

3. A scanning electron microscope according to claim 2, wherein said positive-voltage applying means includes voltage-changing means for changing said positive voltage applied to said control voltage.

4. A scanning electron microscope according to claim 3, wherein said voltage-changing means includes a voltage control unit for controlling said positive voltage applied to said control voltage and an input unit for inputting information to prescribe said positive voltage to be set.

5. A scanning electron microscope according to claim 4, wherein each relationship between each type of a sample to be irradiated with said primary electron beam and a value of voltage to be applied to said sample is stored in said control unit, and a value of voltage to be applied to said sample is automatically set by said control unit based on a type of a sample to be observed by said microscope, which is input via said input unit.

6. A scanning electron microscope according to claim 4, wherein each relationship between a magnifying power to be set to said microscope and a value of voltage to be applied to said sample is stored in said control unit, and a value of voltage to be applied to a sample to be observed by said microscope is automatically set by said control unit based on the magnifying power which is input via said input unit.

7. A scanning electron microscope according to claim 3, wherein a range of said positive voltage to be changed by said voltage-changing means is within 0V to said positive voltage applied to said acceleration tube.

8. A scanning electron microscope according to claim 1, wherein a value of voltage applied to s aid electron gun is in a range of about 2 kV to 5 kV, a positive voltage less than 7 kV is applied to said acceleration tube, and an acceleration voltage of said primary electron beam injected in said sample is adjusted by changing said negative voltage applied to said sample holder and said shield electrode.

9. A scanning electron microscope including an electron source, an object lens for converging a primary electron beam emitted from the electron source, and at least one detector for detecting electrons generated from a sample irradiated with said primary electron beam converged by said object lens, said scanning electron microscope comprising:
   a sample holder for holding said sample on said sample holder;
   a shield electrode located between said object lens and said sample, in which an aperture for passing said primary electron beam is formed;
   negative-voltage applying means for substantially applying the same negative voltage to said sample holder and said shield electrode;
   an acceleration tube located in an electron-beam passing hole in said object lens, provided to pass said primary electron beam, for further accelerating said prary electron beam; and
   a control electrode located between said acceleration tube and said sample, in which an aperture whose size is smaller than said aperture formed in said shield electrode is provided to pass said primary electron beam, a positive voltage in the positive direction to said negative voltage being applied to said control electrode, superimposed on said negative voltage,
   wherein four apertures for passing a laser beam are formed at four places in said control electrodes, which are symmetric with respect to said aperture for passing said primary electron beam formed at the center of said control electrode, and the height of said sample is detected by injecting a laser beam into one of a pair of said apertures arranged in one line and ejecting said laser beam from the other of said pair of said apertures.

10. A scanning electron microscope including an electron source, an object lens for converging a primary electron beam emitted from the electron source, and at least one detector for detecting electrons generated from a sample irradiated with said primary electron beam converged by said object lens, said scanning electron microscope comprising:
    a sample holder for holding said sample on said sample holder;
    a shield electrode located between said object lens and said sample, in which an aperture for passing said primary electron beam is formed;
    negative-voltage applying means for substantially applying the same negative voltage to said sample holder and said shield electrode;
    an acceleration tube located in an electron-beam passing hole in said object lens, provided to pass said prirary electron beam, for further accelerating said primary electron beam; and
    a control electrode located between said acceleration tube and said sample, in which an aperture whose size is smaller than said aperture formed in said shield electrode is provided to pass said primary electron beam, a positive voltage in the positive direction to said negative voltage being applied to said control electrode, superimposed on said negative voltage,
    wherein said object lens is divided into at least two parts, and the same negative voltage as that applied to said sample is applied to one of said two part, which is positioned at a place near said sample.

11. A scanning electron microscope including an electron source, an object lens for converging a primary electron beam emitted from the electron source, and at least one detector for detecting electrons generated from a sample irradiated with said primary electron beam converged by said object lens, said scanning electron microscope comprising:
    a sample holder for holding said sample on said sample holder;
    a shield electrode located between said object lens and said sample, in which an aperture for passing said primary electron beam is formed;
    negative-voltage applying means for substantially applying the same negative voltage to said sample holder and said shield electrode;
    an acceleration tube located in an electron-beam passing hole in said object lens, provided to pass said primary electron beam, for further accelerating said primary electron beam; and
    a control electrode located between said acceleration tube and said sample, in which an aperture whose size is smaller than said aperture formed in said shield electrode is provided to pass said primary electron beam, a positive voltage in the positive direction to said negative voltage being applied to said control electrode, superimposed on said negative voltage,
    wherein said object lens is divided into at least two parts, and one of said two part, which forms an electron-beam passing hole, is used as said acceleration tube.

12. A scanning electron microscope including an electron source, an object lens for converging a primary electron beam emitted from the electron source, and at least one detector for detecting electrons generated from a sample irradiated with said primary electron beam converged by said object lens, said scanning electron microscope comprising:
    a sample holder for holding said sample on said sample holder;
    a shield electrode located between said object lens and said sample, in which an aperture for passing said primary electron beam is formed;
    negative-voltage applying means for substantially applying the same negative voltage to said sample holder and said shield electrode;
    an acceleration tube located in an electron-beam passing hole in said object lens, provided to pass said primary electron beam, for further accelerating said primary electron beam; and
    a control electrode located between said acceleration tube and said sample, in which an aperture whose size is smaller than said aperture formed in said shield electrode is provided to pass said primary electron beam, a positive voltage in the positive direction to said negative voltage being applied to said control electrode, superimposed on said negative voltage,
    said microscope further including a first detector in which a deceleration region to decelerate secondary-signal electrons generated at said sample is formed between said object lens and said electron source, for deflecting said secondary-signal electrons in the direction perpendicular to the axis of said primary electron beam and detecting said secondary-signal electrons; a reflection plate with an aperture for passing said primary electron beam, which is provided between said deceleration region and said electron source; and a second detector which is provided between said deceleration region and said electron source, for deflecting secondary electrons due to collisions of said secondary-signal electrons passing through said deceleration region with said reflection plate in the direction perpendicular to the axis of said primary electron beam and detecting said secondary electrons.

13. A scanning electron microscope according to claim 12, wherein means for deflecting said secondary-signal electrons in each detector includes electric field generation means for generating an electric field perpendicular to the axis of said primary electron beam and magnetic field generation means for generating a magnetic field perpendicular to said electric field, and said magnetic field compensate for the deflection of said primary electron beam, due to said electric field.

14. A scanning electron microscope according to claim 12, wherein said deceleration region includes two half-cylindrical electrodes, different negative voltage being applied to said respective half-cylindrical electrodes, and said electric field to deflect said secondary-signal electrons is formed by applying a voltage in the positive direction and a voltage in the negative direction, which are superimposed on said negative voltage applied to said shield electrode and said sample, to said two half-cylindrical electrodes, respectively.

15. A scanning electron microscope according to claim 14, wherein said half-cylindrical electrode to which said voltage in the positive direction is applied is a mesh-type electrode.

16. A scanning electron microscope according to claim 14, wherein a mesh-type half-cylindrical filter is provided outside said half-cylindrical electrode, changeable voltage being applied to said filter.

17. A scanning electron microscope according to claim 14, wherein a mesh-cover with an aperture for passing said primary electron beam, which is formed at the center of said mesh-cover, is provided at each of the top and bottom regions of said deceleration region composed of said two half-cylindrical electrodes, changeable voltage being applied to said mesh-covers.

18. A scanning electron microscope according to claim 14, wherein said voltage in the positive direction and said voltage in the negative direction, which are superimposed on said negative voltage applied to said shield electrode and said sample, to said two half-cylindrical electrodes, respectively, are changeable.

* * * * *